(12) United States Patent
Kim

(10) Patent No.: US 6,721,209 B2
(45) Date of Patent: Apr. 13, 2004

(54) SEMICONDUCTOR MEMORY DEVICE

(75) Inventor: Jae Woon Kim, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/144,783

(22) Filed: May 15, 2002

(65) Prior Publication Data

US 2002/0172078 A1 Nov. 21, 2002

(30) Foreign Application Priority Data

May 15, 2001 (KR) .......................... 2001-26368

(51) Int. Cl.[7] .............. G11C 7/00; G11C 8/00
(52) U.S. Cl. .................. 365/189.05; 365/230.03; 365/230.08
(58) Field of Search .............. 365/230.03, 230.08, 365/189.05

(56) References Cited

U.S. PATENT DOCUMENTS 5,923,607 A * 7/1999 Suh ................ 365/230.03
6,166,967 A * 12/2000 Do ................ 365/230.03
6,278,650 B1 * 8/2001 Kang .............. 365/230.03
6,327,214 B1 * 12/2001 Yoon et al. ........ 365/230.03
6,331,955 B1 * 12/2001 Shin et al. ........ 365/230.03
6,337,826 B1 * 1/2002 Imai et al. ........ 365/230.03
6,396,766 B1 * 5/2002 Lee ............... 365/230.03

* cited by examiner

Primary Examiner—Trong Phan
(74) Attorney, Agent, or Firm—Birch, Stewart, Kolasch & Birch, LLP

(57) ABSTRACT

A semiconductor memory device suitable for rapidly transferring output data from sense amplifiers to an output-buffer is disclosed. The semiconductor memory device includes a plurality of sense amplifiers respectively connected to a plurality of cell blocks. A first common output-line is connected to a first set of sense amplifiers associated with a first set of cell blocks. A second common output-line is connected to a second set of sense amplifiers associated with a second set of cell blocks. A loading selection circuit selects one of the first and second common output-lines so as to transfer output data from a selected sense amplifier, via the selected one of the first and second common output-lines, to another device, such as an output-buffer.

14 Claims, 3 Drawing Sheets

SEMICONDUCTOR MEMORY DEVICE

This application claims the benefit of the Korean Application No. P2001-26368 filed on May 15, 2001, which is hereby incorporated by reference.

BACKGROUND OF THE INVENTION

1. Field of the Invention

The present invention relates to semiconductor memories, and more particularly, to an output circuit of sense amplifiers. Although the present invention is suitable for a wide scope of applications, it is particularly suitable for rapidly transferring data from sense amplifiers to an output-buffer.

2. Discussion of the Related Art

With the higher integration and increased capacity of semiconductor memories, high-speed processing of semiconductor memory systems is required.

Accordingly, for high speed memories, it is desirable that each of the following constituent components of the memory cycle time be minimized as much as possible; clock-to-wordline selection, cell-to-sense amplifier, and sense amp-to-output.

The teachings of the present invention are particularly directed to reducing the time delay involved in the sense amp-to-output portion of the cycle time.

The sense amplifier is usually provided as a differential sense amplifier, with each of the memory cells providing both a data signal and a data-bar signal on the complementary bitlines associated with each column.

And, the sense amplifier coupled to the two complementary bitlines senses the differential voltage between the two bitlines, and the sensed difference is indicated by the sense amplifier as the different logic states of "0" and "1".

A related art semiconductor memory device will now be described with reference to the accompanying drawings.

FIG. 1 is a block diagram illustrating a related art semiconductor memory device.

As shown in FIG. 1, the related art semiconductor memory device includes a plurality of sense amplifiers 2 coupled to each of the memory cell blocks. The sense amplifiers amplify the data of the bitlines disposed in the memory cell blocks. An output-buffer 4 is coupled to a common output-line of the sense amplifiers to transfer the data of a cell block 1, as selected by an input address, to another device.

A pair of complementary bitlines, which are connected to the sense amplifier, are disposed in a sense amplifier block operable with the memory cell blocks. A plurality of sense amplifiers are accordingly provided for each memory cell. And, each sense amplifier is operable to sense the output of a given column.

The operation of the aforementioned related art semiconductor memory device will be described now. In operation, prior to activating the memory cells, the bitlines are precharged and equalized to a common value.

Once a particular row and column are selected, the memory cell associated therewith is activated such that it pulls one of the data lines toward ground, with the other data line remaining at the precharged level. The sense amplifier coupled to the two complementary bitlines senses the difference between the two bitlines. The sensed difference is indicated by the sense amplifier as the different logic states of "0" and "1". Next, the output-buffer 4, coupled to the common output-line of the sense amplifiers, transfers the data of sense amplifiers to the other device.

The related art semiconductor memory device, discussed above, has several drawbacks. A common output-line between an output-buffer and sense amplifiers has a significant delay in transferring the data from sense amplifiers to the output-buffer. Such delay is not desirable in many high-speed applications.

Further, in multi-bank memory architectures, prevalent in certain applications, the signal path between the sense amplifiers and a common output-line is not only variable but traverses longer distances as well.

SUMMARY OF THE INVENTION

Accordingly, the present invention is directed to a semiconductor memory device that substantially obviates one or more drawbacks, limitations, or disadvantages of the related art.

An object of the present invention is to provide a semiconductor memory device which has two common output-lines so as to rapidly transfer data values on a pair of bitlines.

In a presently preferred exemplary embodiment of the present invention, two common output-lines selectively are connected to a output-buffer according to a memory cell block. The data values on a pair of bitlines are transferred through a common output-line, selected by an input signal, to an output-buffer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof, as well as the appended drawings.

To achieve these objects and other advantages, in accordance with the purpose of the invention, as embodied and broadly described herein, a semiconductor memory device includes a plurality of sense amplifiers respectively connected to a plurality of cell blocks, a first common output-line and a second common output-line transferring the data of the sense amplifiers into two parts according to the cell blocks, and a loading selection circuit selectively loading two common output-lines so as to transfer the data of a selected sense amplifier.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
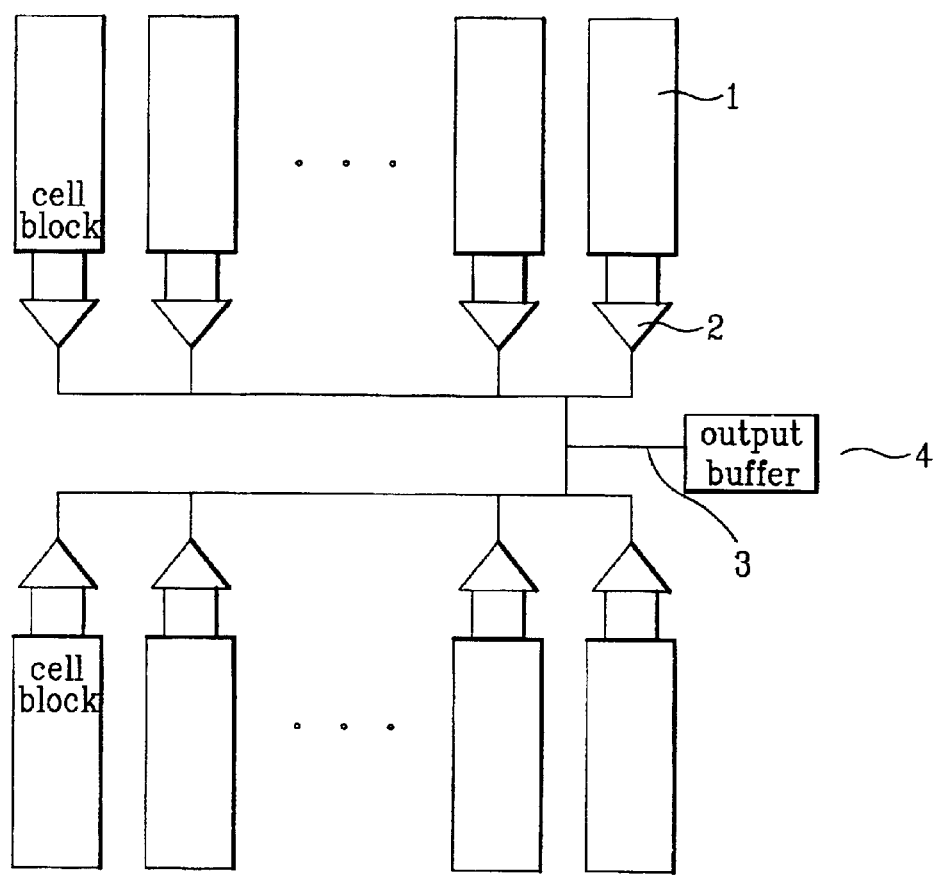
FIG. 1 illustrates a related art semiconductor memory device.
Figure 2:
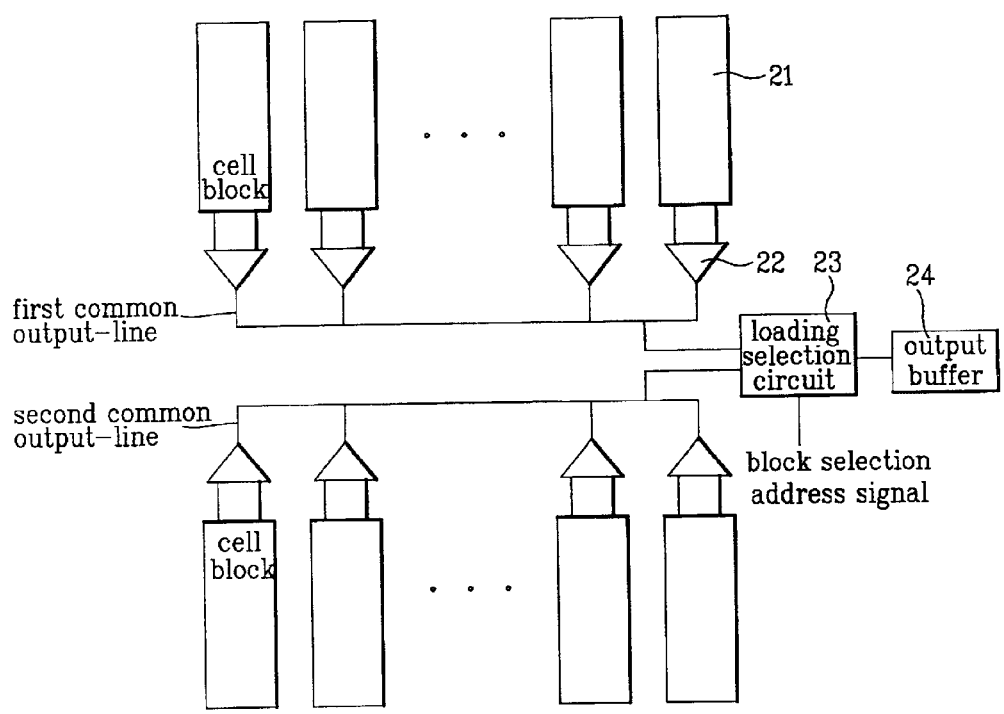
FIG. 2 illustrates a semiconductor memory device according to the present invention.

FIG. 2 summarily illustrates a semiconductor memory device according to the present invention. As shown in FIG. 2, a semiconductor memory device according to the present invention includes a plurality of sense amplifiers 22 which are respectively connected to a plurality of cell blocks 21. The sense amplifiers amplify the difference of two complementary bitlines disposed in a cell block 21. The semiconductor memory device further includes a first common output-line and a second common output-line receiving the data of the sense amplifiers 22 in two parts. A loading selection circuit 23 is connected to the two common output-lines so as to selectively transfer the data of a selected sense amplifier 22, according to a block selection address signal. An output-buffer 24 receives the data of the sense amplifier 22 through the selected common output-line and buffers the data of the sense amplifier 22 so as to transfer the data to another device.

Figure 3:
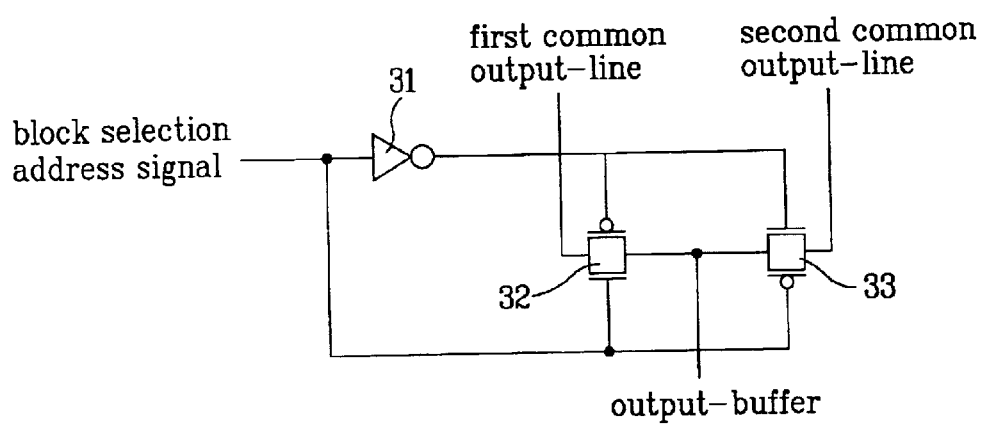
FIG. 3 illustrates a selective loading circuit in a semiconductor memory device according to the present invention.

As shown in FIG. 3, the loading selection circuit 23 comprises an inverter 31 for inverting a block selection address signal. A first transfer gate 32 has a PMOS gate and an NMOS gate, and is provided to transfer the data of a selected sense amplifier 22 from the first common output-line to the output-buffer 24. In the first transfer gate 32, an inverted block selection address signal drives the PMOS gate, and the block selection address signal drives the NMOS gate. A second transfer gate 33 has a PMOS gate and an NMOS gate, and is provided to transfer the data of a selected sense amplifier 22 from the second common output-line to the output-buffer 24. In the second transfer gate 33, the block selection address signal drives the PMOS gate and the inverted block selection address signal drives the NMOS gate.

The sense amplifier 22 for decoding of a selected cell in the cell blocks, selects a 1-bit cell block 21 according to wordline and bitline, and reads an "ON(data 1)" or an "OFF(data 0)" of the 1-bit cell block 21. The common output-line, jointly connected to the sense amplifiers 22, transfers the data of the sense amplifier 22 connected to the 1-bit cell block 21 to the loading selection circuit 23. That is, the data of the sense amplifiers 22, connected to the plurality of cell blocks, are transferred through the first common output-line or the second common output-line.

Subsequently, the loading selection circuit 23 alternatively selects the first common output-line or the second common output-line, according to a block selection address signal. Next, the data of the sense amplifier from the selected common output-line is transferred to the output-buffer 24. To select between the first common output-line and the second common output-line, the loading selection circuit 23 selectively turns on the first transfer gate 32 or the second transfer gate 33, according to a block selection address signal.

For example, if the block selection address signal is "high", an inverted, "low" block selection address signal is applied to the PMOS gate in the first transfer gate 32, and a "high" block selection address signal is applied to the NMOS gate in the first transfer gate 32. Therefore, the first transfer gate 32 is turned on, and then a cell block connected to the first common output-line is selected. The first common output-line transfers the data of the sense amplifier connected to a selected cell block to the output-buffer 24. At this time, the second transfer gate 33 and the second output-line are turned off.

To the contrary, if the block selection address signal is "low", a low block selection address signal is applied to the PMOS gate in the second transfer gate 33, and an inverted, "high" block selection address signal is applied to the NMOS gate in the second transfer gate 33. Therefore, the second transfer gate 33 is turned on, and then a cell block connected to the second common output-line is selected. The second common output-line transfers the data of the sense amplifier connected to a selected cell block to the output-buffer 24. At this time, the first transfer gate 32 and the first common output-line are turned off.

The aforementioned semiconductor memory device according to the present invention has several advantages. For example, transferring selectively the data of the sense amplifiers through two common output-lines according to the cell block, the semiconductor memory device operates with high-speed. Further, by using two shorter-run common output-lines, the likelihood of errors and corruption of data caused by a single, long common output-line is reduced.

It will be apparent to those skilled in the art that various modifications and variations can be made in the present invention. Thus, it is intended that the present invention covers the modifications and variations of this invention, provided they come within the scope of the appended claims and their equivalents.

What is claimed is:

1. A semiconductor memory comprising:
    a plurality of upper cell blocks;
    a plurality of upper sense amplifiers respectively connected to the plurality of upper cell blocks, each of the upper sense amplifiers having a separate output-line;
    a first common output-line connected to the separate output-line of each of the upper sense amplifiers;
    a plurality of lower cell blocks;
    a plurality of lower sense amplifiers respectively connected to the plurality of upper cell blocks, each of the lower sense amplifiers having a separate output-line;
    a second common output-line connected to the separate output-line of each of the lower sense amplifiers; and
    a loading selection circuit connected to the first and second common output-lines and for selecting one of the first and second common output-lines in response to a block selection address signal.

2. The semiconductor memory device in claim 1, wherein the loading selection circuit comprises two transfer gates respectively connected to the first common output-line and the second common output-line.

3. The semiconductor memory device in claim 2, wherein the loading selection circuit turns on one of the two transfer gates to select one of the first and second common output-lines.

4. The semiconductor memory device in claim 1, further comprising:
    an output-buffer connected to the loading selection circuit for buffering an output value of the loading selection circuit.

5. The semiconductor memory device in claim 1, wherein each sense amplifier of the plurality of sense amplifiers amplifies a difference of two complementary bitlines disposed in a cell block.

6. The semiconductor memory device in claim 2, further comprising:
    an output-buffer connected to the loading selection circuit for buffering an output value of the loading selection circuit;

wherein the loading selection circuit includes an inverter inverting a block selection address signal; and wherein the two transfer gates include a first transfer gate having a PMOS gate and an NMOS gate, transferring output data of a selected sense amplifier from the first common output-line to the output-buffer, the inverted block selection address signal driving the PMOS gate and the block selection address signal driving the NMOS gate, and a second transfer gate having a PMOS gate and an NMOS gate, transferring output data of a selected sense amplifier from the second common output-line to the output-buffer, the block selection address signal driving the PMOS gate and the inverted block selection address signal driving the NMOS gate.

7. A semiconductor memory device comprising:

a plurality of upper cell blocks;

a plurality of upper sense amplifiers respectively connected to the plurality of upper cell blocks, each of the upper sense amplifiers having a separate output-line;

a first common output-line connected to separate output-line of each of the upper sense amplifiers;

a plurality of lower cell blocks;

a plurality of lower sense amplifiers respectively connected to the plurality of upper cell blocks, each of the lower sense amplifiers having a separate output-line;

a second common output-line connected to the separate output-line of each of lower sense amplifiers;

a loading selection circuit connected to the first and second common output-lines and for selecting one of the first and second common output-lines in response to a block selection address signal and an output-buffer connected to the loading selection circuit for buffering an output value of the loading selection circuit.

8. The semiconductor memory device in claim 7, wherein the loading selection circuit comprises:

an inverter inverting the block selection address signal;

a first transfer gate having a PMOS gate and an NMOS gate, transferring output data of a selected sense amplifier from the first common output-line to the output-buffer, the inverted block selection address signal driving the PMOS gate and the block selection address signal driving the NMOS gate;

and a second transfer gate having a PMOS gate and an NMOS gate, transferring output data of a selected sense amplifier from the second common output-line to the output-buffer, the block selection address signal driving the PMOS gate and the inverted block selection address signal driving the NMOS gate.

9. The semiconductor memory device in claim 7, wherein the loading selection circuit comprises two transfer gates respectively connected to the first common output-line and the second common output-line.

10. The semiconductor memory device in claim 9, wherein the loading selection circuit turns on one of the two transfer gates to select one of the first and second common output-lines.

11. The semiconductor memory device in claim 7, wherein each sense amplifier of the plurality of sense amplifiers amplifies a difference of two complementary bitlines disposed in a cell block.

12. The semiconductor memory device in claim 11, wherein the loading selection circuit comprises two transfer gates respectively connected to the first common output-line and the second common output-line.

13. The semiconductor memory device in claim 12, wherein the loading selection circuit turns on one of the two transfer gates to select one of the first and second common output-lines.

14. The semiconductor memory device in claim 13, wherein the loading selection circuit includes an inverter inverting the block selection address signal; and wherein the two transfer gates include a first transfer gate having a PMOS gate and an NMOS gate, transferring output data of a selected sense amplifier from the first common output-line to the output-buffer, the inverted block selection address signal driving the PMOS gate and the block selection address signal driving the NMOS gate, and a second transfer gate having a PMOS gate and an NMOS gate, transferring output data of a selected sense amplifier from the second common output-line to the output-buffer, the block selection address signal driving the PMOS gate and the inverted block selection address signal driving the NMOS gate.

* * * * *